(12) United States Patent
Berkovich

(10) Patent No.: US 7,168,025 B1
(45) Date of Patent: Jan. 23, 2007

(54) METHOD OF AND SYSTEM FOR SEARCHING A DATA DICTIONARY WITH FAULT TOLERANT INDEXING

(75) Inventor: Efraim Berkovich, New York, NY (US)

(73) Assignee: Fuzzyfind Corporation, Rockville, MD (US)

( * ) Notice: Subject to any disclaimer, the term of this patent is extended or adjusted under 35 U.S.C. 154(b) by 416 days.

(21) Appl. No.: 09/973,792

(22) Filed: Oct. 11, 2001

(51) Int. Cl.
*H03M 13/00* (2006.01)

(52) U.S. Cl. .................. 714/759; 714/781; 714/783

(58) Field of Classification Search ............... 714/781, 714/783, 759
See application file for complete search history.

(56) References Cited

U.S. PATENT DOCUMENTS

| | | | |
|---|---|---|---|
| 4,290,105 A * | 9/1981 | Cichelli et al. ................ 707/5 |
| 4,414,667 A | 11/1983 | Bennett | |
| 4,538,240 A * | 8/1985 | Carter et al. ................ 708/492 |
| 4,564,944 A * | 1/1986 | Arnold et al. ............... 714/759 |
| 5,490,248 A * | 2/1996 | Dan et al. ..................... 714/6 |
| 5,522,032 A * | 5/1996 | Franaszek et al. ............. 714/6 |
| 5,920,900 A * | 7/1999 | Poole et al. ................ 711/216 |
| 5,968,199 A | 10/1999 | Khayrallah et al. | |
| 6,513,041 B2 * | 1/2003 | Tarin ........................... 707/10 |
| 6,552,673 B2 * | 4/2003 | Webb ........................... 341/67 |
| 6,591,250 B1 * | 7/2003 | Johnson et al. .............. 705/51 |

OTHER PUBLICATIONS

Balakirsky, V.; "Hashing of Databases Based on Indirect Observations of Hamming Distances", *IEEE Transactions on Information Theory*, vol. 42, No. 2, pp. 664-671 (Mar. 1996).

Berkovich, S., et al., "Reversing the Error-Correction Scheme for a Fault-Tolerant Indexing," *The Computer Jour.*, vol. 43, No. 1, pp. 54-64 (2000).

Junior P., et al., "Hard Decision Decoding of the (23,12,7) Golay Code," *George Washington Univ., School of Eng. And Appl. Sci.*, (May 1994).

Lin, S., et al., "Error Control Coding Fundamentals and Applications," Chapt. 5.3-The Golay Code, pp. 134-139 (1983).

Pless, V., "Introduction to the Theory of Error-Correcting Codes," 3rd ed., pp. 4, 5, 21-24, 29-32, 35, 86, 96, 99, 101-105, 114, 133, 148, 151, 152, 175, 176 (1998).

Wiederhold, G., "Database Design" McGraw-Hill Book Company, p. 576 (1977).

* cited by examiner

*Primary Examiner*—Joseph D. Torres
(74) *Attorney, Agent, or Firm*—Fulbright & Jaworski L.L.P.

(57) ABSTRACT

A data dictionary uses a reverse error correction procedure to identify near matches, tolerating mismatches at Hamming's distance 2 utilizing pairwise combinations of indices of a central index decoding sphere and all adjacent decoding spheres (each index identified as a vector defining the center of the decoding sphere) to form sets of hash indices for storing a dictionary entry. Using a Golay code procedure, this arrangement resolves the cases of dictionary entries at distances three and two from the center of a particular central index decoding sphere. In the former case, five adjacent decoding spheres are identified with the dictionary entry stored in the fifteen pairwise combinations formed by the central index and these five adjacent spheres. In the latter case, the twenty-one adjacent decoding spheres are identified, and the data entry is stored in the twenty-one concatenated arrangements formed by the central index and the twenty-one adjacent decoding spheres.

18 Claims, 12 Drawing Sheets

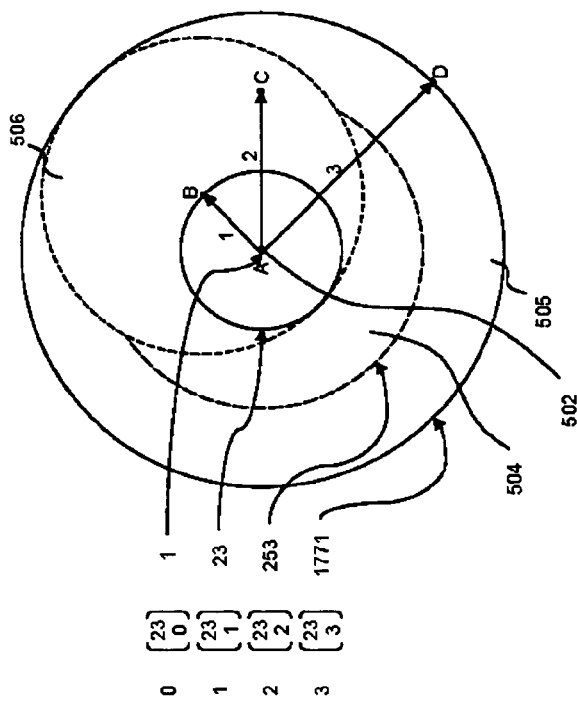
Figure 5A
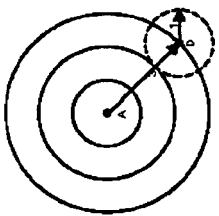
Figure 5E
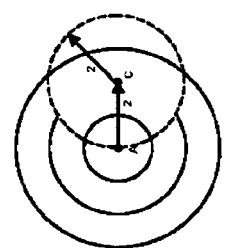
Figure 5D
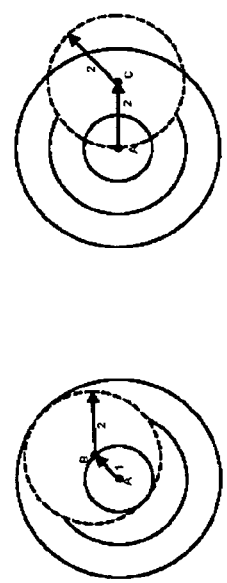
Figure 5C
Figure 5B

| Hash Index | List of Data Items |
|---|---|
| 0 | 4, 88, 1022 |
| 1 | 5, 23, 1202, 3008, 4500 |
| 2 | 4, 12, 13, 88 |
| ... | |

Six 12-bt indices (X's indicate coinciding values)

<1,2>, <1,3>, <1,4>, <1,5>, <1,6>,
<2,3>, <2,4>, <2,5>, <2,6>,
<3,4>, <3,5>, <3,6>,
<4,5>, <4,6>,
<5,6>

15 identifying index pairs:

<b,c>, <b,d>, <b,e>, <b,g>, <b,j>
<c,d>, <c,e>, <c,g>, <c,j>
<d,e>, <d,g>, <d,j>
<e,g>, <e,j>
<g,j>

<a,b>, <a,f>, <a,g>, <a,h>, <a,i>
<b,f>, <b,g>, <b,h>, <b,i>
<f,g>, <f,h>, <f,i>
<g,h>, <g,i>
<h,i>

METHOD OF AND SYSTEM FOR SEARCHING A DATA DICTIONARY WITH FAULT TOLERANT INDEXING

TECHNICAL FIELD

The invention is related to computer systems and more particularly to a method of and system for retrieving items with approximately matching attributes.

BACKGROUND ART

One of the important operations in information processing is retrieving items with approximately matching attributes. In essence, this problem can be treated as follows. Consider a set of information items that are characterized by binary vectors with bit-position values featuring the presence or absence of corresponding attributes. The attributes may include, for example, the presence or absence of respective search terms, letters of an alphabet constituting a word or phrase, or any other set of qualities exhibited by an item. Then, given a binary vector specified in a similar way by attributes of a requested item, it is necessary to select from the considered set near-matching binary vectors, i.e., those vectors which are close to the given vector in terms of the Hamming metric. Such a near-match procedure is encountered in different information processing constructions.

In computer systems, a primitive searching operation is retrieving words by exact matching. More advanced types of information retrieval are based on some sophisticated combinations involving this primitive operation. The near-match procedure is related to the problem of a neighborhood search in a multidimensional space. In general, there is no efficient solution to this problem. Normally, it is based on a brute-force approach which implies sequential comparison of all the elements of the system with a given information item or taking each individual element in a neighborhood of a given information item for direct access to the system. The former strategy would require O(N) operations where N is the number of elements in the system. The latter strategy would require a combinatorial number of accesses depending on the specified size of the neighborhood of a given binary vector.

More recently, a near-match procedure has been described by Berkovich, S., El-Qawasheh, E., "Reversing the Error-Correction Scheme for a Fault-Tolerant Indexing," *The Computer Journal*, vol. 43, no. 1, pp. 54–64 (2000), incorporated herein in its entirety. In this work, for the realization of the near-match procedure, the authors suggest employing a hash coding method. In this case, the comparison of information items is organized using indices that are obtained by a hash transformation function. With a hash method, the retrieval procedure takes on average O(1) operations with a small overhead to resolve collisions.

Searching with not exactly matching information items, can be done using a hash transformation that tolerates some distortions. For approximate matching of words in information retrieval systems such a fault-tolerant hashing can be implemented as a two step process. At the first step, an entering character string is transformed to a reduced form to provide the same code for anticipated distortions of given words. At the second step, a hash transformation is applied to this reduced form of the word. Resolution of collisions of hash coding utilizes an approximate comparison of the original character strings. The most popular realization of this approach is based on the so-called Soundex concept, which is designed to provide the same reduced form for phonetically similar names (see, e.g., Wiederhold, G, *Database Design*, McGraw-Hill Inc., N.Y. (1983). Coding names in Soundex is performed by retaining the first letter of the name while dropping all the vowels from the remaining letters. After that, the remaining letters are replaced by numbers according to a set of rules.

The authors suggest a systematic approach to the expression of closeness relying upon representation of object attributes by binary vectors of a fixed length. In this case, a collection of objects close to a given object can be defined as a set of binary vectors located within a certain Hamming distance from a binary vector of a given object. A relationship between a hashing technique and the Hamming distance concept has been considered in the paper Balakirsky, V. "Hashing of databases based on indirect observations of Hamming distances", *IEEE Trans. Inform. Theory*, vol. 42, pp. 664–671 (1996). The representation of binary attribute vectors involving a regular partitioning of a multidimensional binary cube suggests employing the mathematical technique of error-correction codes. This idea reverses the conventional scheme of application of error-correction codes as illustrated in FIG. 1.

This method of indexing information objects with a certain tolerance in terms of Hamming metric utilizes hash transformation based on a decoding procedure of error-correction codes. In conventional usage of error-correction codes, a dispatched dataword is supplemented with extra bits so that a longer sequence of bits called codeword can be used at the receiver site for recovering a distortion in the original data. Error-correction codes are described by three parameters: (n,k,d), where n is the length of the codeword, k is the length of the dataword, and d is the minimum Hamming distance between the codewords.

To provide fault-tolerant indexing, the authors suggest reversing the conventional application of error-correction coding (FIG. 1). Considering the decoding procedure as a primary operation, a neighborhood of codewords may be mapped into a smaller collection of datawords. Then, these datawords can constitute hash indices to provide search for binary vectors that are close in Hamming's metric.

For purposes of illustration, the possibility of using Hamming code (7,4,3) is shown in Table 1. This code consists of 16 datawords of 4-bit length; each dataword corresponding to a decoding sphere of radius 1 in a 7-dimensional binary cube. To deliver a 4-bit message, the sender expands the 4-bit message by adding 3 bits to it, and transmits the 7 bits instead of 4. For example, a message such as 1001 will be converted into a 7-bit codeword 1001011, which is the center of a decoding (i.e., codeword) sphere. The receiver can reconstruct the transmitted 7-bit codeword, as long as it remains in the codeword sphere having no more than a one-bit distortion.

TABLE 1

Illustration of perfect mapping for a Hash transformation with Hamming code (7,4,3)

| Hash indices | Codeword spheres |
|---|---|
| 0000 | 0000000, 0000001, 0000010, 0000100, 0001000, 0010000, 0100000, 1000000 |
| 0001 | 0001101, 0001100, 0001111, 0001001, 0000101, 0011101, 0101101, 1001101 |
| 0010 | 0010111, 0010110, 0010101, 0010011, 0011111, 0000111, 0110111, 1010111 |
| 0011 | 0011010, 0011011, 0011000, 0011110, 0010010, 0001010, 0111010, 1011010 |
| 0100 | 0100011, 0100010, 0100001, 0100111, 0101011, 0110011, 0000011, 1100011 |
| 0101 | 0101110, 0101111, 0101100, 0101010, 0100110, 0111110, 0001110, 1101110 |
| 0110 | 0110100, 0110101, 0110110, 0110000, 0111100, 0100100, 0010100, 1110100 |
| 0111 | 0111001, 0111000, 0111011, 0111101, 0110001, 0101001, 0011001, 1111001 |
| 1000 | 1000110, 1000111, 1000100, 1000010, 1001110, 1010110, 1100110, 0000110 |
| 1001 | 1001011, 1001010, 1001001, 1001111, 1000011, 1011011, 1101011, 0001011 |
| 1010 | 1010001, 1010000, 1010011, 1010101, 1011001, 1000001, 1110001, 0010001 |
| 1011 | 1011100, 1011101, 1011110, 1011000, 1010100, 1001100, 1111100, 0011100 |
| 1100 | 1100101, 1100100, 1100111, 1100001, 1101101, 1110101, 1000101, 0100101 |
| 1101 | 1101000, 1101001, 1101010, 1101100, 1100000, 1111000, 1001000, 0101000 |
| 1110 | 1110010, 1110011, 1110000, 1110110, 1111010, 1100010, 1010010, 0110010 |
| 1111 | 1111111, 1111110, 1111101, 1111011, 1110111, 1101111, 1011111, 0111111 |

In the suggested fault-tolerant indexing technique, this scheme is reversed. That is, given a 7-bit key, a hash index of this key is determined by the decoding procedure, so it represents a dataword. For instance, the above-considered 7-bit key 1001011 will get a hash index equal to 1001. Then, consider a one-bit distortion of this 7-bit key, for example, 1001111. The decoding procedure applied to this distortion will yield the same dataword: 1001. Thus, with this hashing function, any 7-bit key at a Hamming distance 1 from the given key 1001011 can be retrieved through the same hash index 1001. However, this simple retrieval tolerating a one-bit mismatch occurs only if a given key represents the center of a codeword sphere. Otherwise, keys at Hamming's distance 1 may belong to an adjacent sphere. In this case, the retrieval procedure has to be expanded to probe more hash indices.

That is, of the 128 keys, sixteen correspond to the 7-bit codewords for respective 4-bit datawords, while the remaining 112 keys are the one-bit distortions of these codewords. Thus, while a one-bit mismatch of the 7-bit codeword will be "corrected" to yield the original dataword, one-bit mismatches of the remaining 112 keys (which already represent a one-bit distortion) may either (i) one out of seven times negate the original mismatch or (ii) six out of seven times result in a key that, when "corrected" yields an incorrect dataword.

Generally, a tolerance to one-bit mismatch can be implemented via brute-force by probing each hash index corresponding to all one-bit modifications of a given word. This would involve inspecting 8 hash buckets: one determined by the hash value of this key and 7 buckets determined by the hash values of all of its one-bit modifications. The suggested scheme employing error-correction codes for a fault-tolerant retrieval gives an advantage of reducing the excessiveness of this brute-force procedure.

For clarification, consider how the fault-tolerant retrieval can be organized for a 7-bit key: 1001100. This retrieval would require probing the hash values for all of the following key modifications of this key:

1001100+0000000=1001100→1011
1001100+0000001=1001101→0001
1001100+0000010=1001110→1000
1001100+0000100=1001000→1101
1001100+0001000=1000100→1000
1001100+0010000=1011100→1011
1001100+0100000=1101100→1101
1001100+1000000=0001100→0001

Here and below, in manipulations with binary code vectors the sign "+" means the mod 2 addition. In Table 1 the modified key values are underlined in the highlighted codeword spheres. We can see that there are just 4 hash values for all possible one-bit distortions of the original vector. In other words, with this hash transformation, the number of probes in a searching procedure reduces from 8 to 4.

The Hamming code (7,4,3) is perfect in the sense that the codewords represent all possible 7-bit combinations: $2^7=128$. Thus, a decoding procedure of such a code can be directly used for the described fault-tolerant hash transformation. The suggested approach can also be realized using non-perfect codes, but would require a certain adaptation to the decoding procedure and will result in less regular structural developments. Unfortunately, perfect codes are rare. Thus, Hamming codes, a family of (2m−1, 2m−m−1, 3) codes for any positive integer m≧3, form a class of single-error-correcting perfect codes. "Besides the Hamming codes the only other nontrivial binary perfect code is the (23,12)

Golay code" (see, e.g., Lin, S. and Costello, D. (1983) Error Control Coding: Fundamentals and Applications. Hall Inc., Englewood Cliffs, NJ.)

The practicality of the suggested technique of fault-tolerant indexing is determined by the amount of redundancy employed by the hash transformation. Apparently, this redundancy would be decreased if the space of binary vectors of the attributes were partitioned with bigger codeword spheres. In this respect, the Golay code capable of correcting three errors by virtue of the minimum Hamming distance between the codewords of 7 has a definite advantage over single-error-correcting Hamming codes where this minimum distance is only 3. It turns out that the fault-tolerant indexing utilizing the Golay code (23, 12, 7) can be rather effective for near-match searches in real information systems of a reasonable size. A description of the Golay code (23, 12, 7) and implementation thereof can be found in U.S. Pat. No. 4,414,667 of Bennett entitled "Forward Error Correcting Apparatus" issued Nov. 18, 1983 and U.S. Pat. No. 5,968,199 of Khayrallah et al. entitled "High Performance Error Control Decoder" issued Oct. 19, 1999, both of which are incorporated herein by reference in their entirety.

The Golay code transforms 12-bit messages using 11 correction bits. Thus, $2^{12}=4096$ binary vectors are transformed into 23-bit codewords. Each codeword is associated with a decoding sphere containing all vectors that are at Hamming distance $\leq 3$ from the codeword. The number of the 23-bit vectors in these spheres, T, is $$T = \binom{23}{0} + \binom{23}{1} + \binom{23}{2} + \binom{23}{3} \quad (1)$$
$$= (1 + 23 + 253) + 1771$$
$$= 277 + 1771 = 2048 = 2^{11}$$

The Golay code (23,12,7) is perfect in the sense that the codeword spheres cover all possible 23-bit combinations $2^{23}=2^{12} \cdot 2^{11}$.

The Golay code can be applied for fault-tolerant hashing because of its basic properties and related procedures. That is, the Golay code (23,12,7) can be treated as a cyclic code, an important subclass of linear codes, whose implementation is simplified by using algebraic manipulations with generating polynomials rather than computations with parity check matrices. Thus, the Golay code (23,12,7) can be generated by either of the following polynomials (see, e.g., Lin, S. and Costello, D. (1983) *Error Control Coding: Fundamentals and Applications*. Hall Inc., Englewood Cliffs, NJ):

$$G_1(x)=1+x^2+x^4+x^5+x^6+x^{10}+x^{11} \quad (2)$$

$$G_2(x)=1+x+x^5+x^6+x^7+x^9+x^{11} \quad (3)$$

The 23-bit vectors of the Golay code having the coordinates labeled from 0 through 22 are represented by congruence classes of polynomials modulo $(x^{23}-1)$ with corresponding coefficients in a binary field GF(2).

The encoding and decoding procedures have been realized following the algorithmic constructions given in Vasconcellos, P., Vojcic, B., and Pickholtz, R. (1994) Hard Decision Decoding of the (23,12,7) Golay Code, *Tech. Rep.*, George Washington University, USA which are described below for the sake of convenience. The author's application of the Golay codes, being oriented towards information retrieval, requires manipulations with binary vectors in a way as if they were regular hash indices. This has been implemented with the C language featuring binary vectors as "unsigned long integers" of 32 bits. Thus, the generator polynomials are respectively: 3189 and 2787. The operations of addition, multiplication, and division of the polynomials have been expressed by bitwise operations of "exclusive OR" and shifting.

The data message word is a 12-bit binary vector, that is, an integer in the range from 0 to 4095. Adding 11 parity-check bits results in a 23-bit codeword of binary-valued components $(a_0, a_1, a_2, \ldots, a_{21}, a_{22})$. Let the data message be represented by the polynomial I(x):

$$I(x)=a_{11}x^{11}+a_{12}x^{12}+ \ldots +a_{22}x^{22} \quad (4)$$

and the parity check by the polynomial P(x):

$$P(x)=a_0+a_1x+a_2x^2+ \ldots +a_{10}x^{10} \quad (5)$$

Then a codeword C(x) is represented by:

$$C(x)=I(x)+P(x) \quad (6)$$

A codeword C(x) must be a multiple of the generator polynomial:

$$C(x)=Q(x)G(x) \quad (7)$$

where G(x) is one of the polynomials $G_1(x)$ or $G_2(x)$ and Q(x) is a polynomial of degree 11. Taking into account equation (6) and dividing I(x) by G(x), we get:

$$I(x)=Q(x)G(x)+P(x) \quad (8)$$

Thus, the encoding procedure consists of the following three steps:

1—Multiply the message polynomial by $x^{11}$ to obtain I(x)
2—Divide I(x) by G(x) to obtain the remainder P(x)
3—Form the codeword by combining I(x)+P(x)

A decoding procedure is converting a 23-bit codeword into the 12-bit original message. Let M(x) be the received vector. Suppose that the original codeword was corrupted by adding an error pattern E(x) containing 3 or less "1":

$$M(x)=C(x)+E(x) \quad (9)$$

Further, dividing by G(x) we get:

$$M(x)=A(x)G(x)+S(x) \quad (10)$$

where S(x), a polynomial of degree 10 or less, is the syndrome of the received vector M(x). The syndrome S(x) =0 if and only if M(x) is a codeword.

Since C(x) is a multiple of the polynomial G(x), we have $$E(x)=[A(x)+Q(x)]G(x)+S(x) \quad (11)$$

There is a one-to-one correspondence between $2^{11}$ 23-bit patterns with 3 or fewer errors and $2^{11}$ distinct syndromes. So, a table of $2^{11}=2048$ possible error patterns associated with syndromes can be constructed. This can be done by dividing all possible error vectors by the generator polynomial. The decoding procedure goes as follows:

1—Calculate the syndrome of the received vector
2—Enter the table to obtain the error pattern
3—Add the error pattern to the received vector So, a table of 2"=2048 possible error patterns associated with syndromes can be constructed.

Using the Golay code for fault-tolerant indexing is based on an observation represented by the following lemma. On one hand, this lemma can be derived as a corollary from the association of the Golay code with combinatorial designs (see, e.g., Pless, V. (1998) *Introduction to the Theory of Error-Correction Codes*, John Wiley & Sons, Inc., New York.). On the other hand, the statement of this lemma can be easily tested by an exhaustive computer search. However, a direct proof of this lemma provides an instructive geometrical insight into the details of the suggested technique.

Given a 23 dimensional binary cube partitioned into $2^{12}$ equal spheres, a probing sphere with a Hamming radius of 1 placed in this cube either lies completely within one of the decoding spheres, or spreads uniformly over six decoding spheres. Thus, considering a decoding sphere with a center at $P_o$, according to equation (1), this sphere will contain 2048 points which are divided into four categories depending on their distance from $P_o$. Considering two cases determined by the distance, $D(P_o,T_o)$, between $P_o$ and the center of a probing sphere $T_o$:

Case #1: $0 \leq D(P_o,T_o) \leq 2$. In this case, the probing sphere with a radius of 1 fits completely into a decoding sphere with a radius of 3.

Case #2: $D(P_o,T_o)=3$. To begin with, let us introduce a set U of 23-bit vectors of no more than unit weight which constitute the probing sphere of radius 1: $U=\{u_0, u_1, u_2, \ldots u_{23}\}$, where $u_0=(000 \ldots 00)$, $u_1=(000 \ldots 01)$, $u_2=(000 \ldots 10)$, $u_{22}=(010 \ldots 00)$, $u_{23}=(100 \ldots 00)$ Then, $T_o$, the center of a probing sphere, can be represented with three different fixed unit vectors, say $u_i$, $u_j$, and $u_k$:

$$T_o = P_o + u_i + u_j + u_k \quad (12)$$

The points, $T_s$, which constitutes this probing sphere can be represented by means of all one bit modifications of the vector (12):

$$T_s = P_o + u_i + u_j + u_k + u_s \quad (13)$$

Where $s=1, 2, \ldots, 23$. First consider the situation where $s=i$, $s=j$, and $s=k$. In this situation, $u_s$ cancels with one of the fixed vectors and the $T_s$ stays within the decoding sphere $P_o$. Thus, four vectors of U with $s=i$, $s=j$, and $s=k$ together with $s=0$ fall in the decoding sphere with the center at $P_0$.

Now, consider a modification of $T_o$ by another vector us where s is different from i, j, k, or 0. Apparently, this vector, say $u_w$, falls into an adjacent decoding sphere that is at a distance of 3 from its center, $P_1$. So, we have $$P_o + u_i + u_j + u_k + u_w = P_1 + u_x + u_y + u_z \quad (14)$$

Vectors $u_x$, $u_y$, and $u_z$ are all different and none of them can be equal $u_i$, $u_j$, $u_k$ or $u_w$. Otherwise, the distance between $P_o$ and $P_1$ would be less than 7, in contradiction to the property of the Golay code partitioning. The equality (14) can be rewritten in three other ways by swapping $u_w$ with each of the $u_x$, $u_y$, and $u_z$. This means that each of the four points of the probing sphere with the center in $T_o$: $T_w$, $T_x$, $T_y$, and $T_z$, goes to the adjacent decoding sphere with the center in $P_1$. So, of 24 points constituting the probing sphere we have located a quadruple of points in the original partitioning sphere and another quadruple of points in an adjacent decoding sphere. By continuing the described procedure and selecting another us vector with a value of s different from any of the considered indexes, we can find another quadruple of points falling in a different adjacent sphere. This procedure can be repeated until all of the points of U are exhausted. As a result, we will establish that the 24 points of U are combined in different quadruples and fall in different adjacent partitioning spheres. Therefore, in the case # 2 when $D(P_0, T_0)=3$, we always get 6 different decoding spheres The searching logic of fault-tolerant indexing can be organized with the Golay code partitioning in the same way as has been illustrated with Hamming code. The case # 1 corresponds to creation of one central hash index; this would occur in 277/2048=13.5% of all situations. The case # 2 corresponds to creation of 6 hash indices—one central and 5 peripheral; this would occur in 1771/2048=86.5% of all situations.

Applying the presented analysis for the Golay code to partitioning of multi-dimensional binary cubes with perfect Hamming codes ($2^m-1$, $2^m-m-1$, 3) one can obtain analogous results. Namely, a probing sphere with a Hamming radius of 1 placed in this cube either lies completely within one of the decoding spheres, or spreads uniformly over $2^{m-1}$ decoding spheres. So, for m=3, i.e., for the Hamming code (7,4,3), we get four partitioning spheres as shown in Table 1. Further, the case when the probing sphere falls in only one decoding sphere occurs very infrequently, in 1 of $2^m$ situations. Thus, employing Hamming codes ($2^m-1$, $2^m-m-1$, 3) for the suggested technique of fault-tolerant indexing will require essentially $2^{m-1}$ hash indices. This implies involving a substantially higher redundancy in comparison to the Golay code. Therefore, the perfect partitioning offered by the Golay code appears most advantageous for implementation of the suggested technique of fault-tolerant indexing.

The elementary computer operation available for data retrieval is a strict comparison of one word with another. In searching for exact matching a given key is compared with certain keys stored in the system. The realization of approximate matching relies upon expansion of comparison operations. Those involve a matching neighborhood of a given key for access and replication in the storage system. In other words, realization of approximate matching requires redundant efforts in terms of time and/or space: on one hand, it is possible to test matching neighborhoods by increasing the number of accesses, on the other hand, this can be done by replicating the information inside the memory. The retrieval capabilities depend only on the sizes of the matching neighborhoods, irrespective of whether they are introduced on the side of "time" or "space".

The Golay code offers different possibilities for the realization of the suggested fault-tolerant indexing technique. Variations in the sizes of the matching neighborhoods can be intermixed with a combined usage of both kinds of the Golay codes corresponding to different generating polynomials. The retrieval capabilities of these variations are presented in FIGS. 2A–2F. The recall for a given key—the percentage of accessible keys with respect to the total number of keys at a certain Hamming's distance—does not depend on how matching operations are organized. The data can be stored with no replication and accessed several times or replicated in the storage and accessed once.

Notations for the considered formation variations are specified by the sizes of matching neighborhoods. The case 1-1 shown in FIG. 2A means matching two neighborhoods of size 1, i.e., just a direct matching of 12-bit hashes. Of course, this matching gives a 100% recall when the 23-bit vectors are equal (Hamming distance equals 0), but occasionally a small portion of matches occurs for keys with higher Hamming distances. The case 1-6 shown in FIG. 2B corresponds to matching neighborhoods of size 1 vs. 6. In this situation, for the Hamming distance 1 we get a 100% recall. The case 6-6 shown in FIG. 2C presents matching neighborhoods of size 6 vs. 6. The remaining three cases of FIGS. 2D–2F show corresponding matchings for the two kinds of the Golay code partitionings. So, for example, the case 2-12 means that two neighborhoods of size 1 are matched vs. two neighborhoods of size 6.

The sizes of the matching neighborhoods used in the notations of FIGS. 2A–2F give an approximate estimate for the required redundancies. The actual redundancy is less because a matching neighborhood of size 6 represented by a sphere of a radius 1 has about 0.135 probability to be reduced to a size 1 as it falls completely in a decoding sphere. The calculated values of actual redundancies are given in Table 2.

TABLE 2

Time-Space Redundancies

| Searching Scheme | Redundancy |
|---|---|
| 1-1 | 1-1 |
| 1-6 | 1-5.32 |
| 6-6 | 5.32-5.32 |
| 2-2 | 1.97-1.97 |
| 2-12 | 1.97-10.33 |
| 12-12 | 10.33-10.33 |

The choice of an appropriate searching scheme depends upon a compromise between desired retrieval characteristics and implementation overhead (FIGS. 2A–2F). Schemes 1-1 and 2-2 do not offer a tangible retrieval enhancement beyond exact matching. The scheme 1-6 and 2-12 give a 100% assurance of retrieving keys only at Hamming distance one. However, searching within neighborhood of radius 1 may not be sufficient for some applications. The case 12-12 provides full retrieval capabilities for keys at Hamming distance 2 and more than 80% chances of retrieval for keys at Hamming distance 3 and 4. However, this imposes a high redundancy both in time and space. The remaining case, 6-6, offers almost the same retrieval performance but with a substantially less redundancy. The retrieval performance of this scheme is rather significant, it guarantees a 100% recall when the distance between two keys is less than or equal two. It turns out that for two keys at Hamming's distance 2 having 6 hashes each there are always two values in common. Thus, the case 6-6 is considered an exemplary searching scheme with a reasonable overhead. Computational arrangements with this scheme are shown in the diagram of FIG. 3, while an implementation of this scheme is presented in FIG. 4 described in further detail below.

There might be further elaboration of the organization of fault-tolerant indexing. In particular, the matching neighborhood can be extended to the radius 2. For a straightforward brute-force approach in the case of 23-bit vectors this would imply a 277 redundancy factor. Using the Golay code, this factor will be reduced to 22. With such high replication in memory it becomes possible to search keys at Hamming's distance 2 with only one access to memory. This can be instrumental in some time-constrained applications when saving memory is of less importance for example, for signal processing with vector-quantization. Prior work has focused on the basic 6-6 scheme.

The Golay code is used as a hash index of a list of buckets, each bucket storing a corresponding binary attribute vector that hashes into that index. As described, 86.5% of the vectors will have six Golay hash indices, each of 12 bits, while 13.5% will have a single 12-bit hash index. Thus, each vector will be found in either six buckets corresponding to its six Golay hash indices, or in one bucket at its single Golay hash index. FIG. 3 can be used to illustrate this technique.

As a basic scheme for the suggested technique of fault-tolerant indexing has considered the 6-6 scheme as having an acceptable trade-off between the space-time redundancy and retrieval characteristics. Searching with this scheme yields the whole neighborhood of a given binary vector at Hamming's distance 2 and a certain portion of the neighborhoods at greater distances (see FIG. 2C). The speed of searching operations for this basic scheme may be enhanced with some adjustments. Thus, for example, the number of hash indices, either on the part of storing or accessing can be reduced from 6 to 5. This still guarantees the retrieval of binary vectors at Hamming distance 2 but sacrifices the recall of binary vectors at higher Hamming distances Utilization the main 6-6 variant of this searching scheme begins with filling the hash table. The hash table presents an array of $2^{12}$=4096 pointers to the buckets with the 23-bit keys. Both kinds of the binary vectors, the 12-bit indices to the array and 23-bit keys, may be represented as unsigned integers by 32-bit words. For example, a 23-bit vector: (0,0,0,0,0,0,0,0,0,0,0,0,0,0,0,0,0,1,0,1,1,0,1) with "1" in positions: 5, 3, 2, and 0 is represented as an unsigned long integer: $45=2^5+2^3+2^2+2^0$. For this 23-bit key we get 6 unsigned long integers as 12-bit hash indices: 0, 47, 61, 493, 1581, and 2093. These 6 numbers are used to access the 4096 array pointers the 6 buckets in each of which the considered key 45 is to be inserted.

In general, searching with this hash table requires traversing all 6 buckets associated with a given key. The performance of searching is determined primarily by the average size of the buckets. For ordinary hashing, a set of 4096 random uniformly distributed keys would be accommodated in this table in buckets of a small average size. For the suggested fault-tolerant indexing inserting 4096 keys in the 4096 position hash table would result in about 6 times redundancy. Ideally, we would get 4096 buckets of size of 6, or more accurately of the size 5.32. However, the average bucket size exceeds this redundancy coefficient because of shrinking of scattering intervals depending on particular patterns of incoming binary vectors.

While this technique limits the searching required so that close matches will have hashes overlapping with that of the target, it still requires the search of several lists, particularly in those 86.5% of cases where six indices are produced. These lists may become very long as the number of vectors to be stored in or referenced by the hash table approach and exceed the size of the 12-bit hash index available.

The close matching technique described provides a valuable tool for retrieving items with approximately matching attributes. However, an efficient implementation of the technique is limited to relatively small sets of items. Also, the prior implementation of this technique relies on an exhaustive method of producing distortions of a codeword to identify nearby codewords in adjacent data spheres, as shown in FIG. 4.

SUMMARY OF THE INVENTION

The invention is directed to a data storage structure, search engine and method that provide an efficient and expandable mechanism for storing and identifying bit-attribute vectors that are exact and close matches to a target-vector. The invention exploits the structure of certain perfect error-correction reverse transformations and the index pairing property of the indices generated to both reduce the number of locations to be searched and expand the storage interval, thereby reducing collisions and the number of indices per list. The invention further provides for an improved method of using the pair property to identify vectors falling within a predetermined Hamming distance of the target value without requiring comparison between the target and the vector under consideration.

The invention provides an efficient implementation of a data dictionary using an inverse fault-tolerant decoder based on an error correcting code, e.g., the Golay code (23, 12, 7). A method according to the invention for generating hash indices avoids exhaustive codeword modification to identify nearby codewords by employing a systematic technique to identify adjacent codeword spheres. In particular, rather than permuting all permissible distortions of a codeword, the invention systematically probes outward from a vector location within a central index decoding (i.e., partition) sphere to identify all adjacent code spheres containing distortions of the subject codeword falling within a predetermined Hamming metric of the subject codeword. The codewords are then "decoded" to obtain respective data words associated with the central index and adjacent code spheres. The invention further employs data word pairing to extend the hash table size beyond the limited number of bits directly supported by a particular error-correcting code. For example, the invention concatenates, in lexicographical order, pairs of data words to double the size of the hash key.

Other aspects of the invention include methods for eliminating redundant retrieval of duplicated entries using a selection tree or a pairing table, together with a method or cleaning-up the table to avoid subsequent table initialization. These methods to eliminate duplicate entries may be used instead of pairing of indices (a technique that inherently eliminates duplicate retrieval of most multiple entries) or in addition to pairing to eliminate multiple output of duplicate entries resulting from, for example, exact matches. When used in combination with pairing, combinational logic combines pairs of the index values to form corresponding combined hash indices. A data store (e.g., computer memory) is configured as a hash table referencing indexed data corresponding to the combined hash indices.

According to a feature of the invention, the data vector may comprise a bit-attribute vector.

According to another feature of the invention, an inverse fault-tolerant decoder may implement a reverse perfect error correction code including, for an example, a reverse Golay code.

According to another feature of the invention, the inverse fault tolerant decoder is further configured to identify the data vector as one of (i) a border vector type located at a border of a decoding sphere and (ii) a non-border vector type located interior to the decoding sphere.

According to another feature of the invention, the fault-tolerant decoder is configured to identify that a particular data vector is a border vector type (i.e., represents a codeword having a maximum number of distortions correctable by the code.) In this border case, the decoder defines an offset of the data vector (e.g., error vector) from a center of a decoding sphere of an error-correction code implemented by the inverse fault-tolerant decoder. The decoder then identifies possible offsets from adjacent decoding spheres of the error-correction code until the combinations fill-in all bit positions corresponding to the data vector such that centers of the adjacent decoding spheres correspond to the index values.

Another feature of the invention addresses non-border (i.e., interior) codewords having permissible distortions falling outside a central index decoding sphere wherein a fault-tolerant decoder implements a reverse Golay code. In this case, the decoder is configured to identify the data vector as a non-border vector type and to identify an offset vector of the data vector from a center of a central index decoding sphere representing a specified offset distance. Centers of adjacent decoding spheres within the specified offset distance of the data vector are then identified, and pairwise combined with the center of the central index decoding sphere to form pairs of indexes.

According to another feature of the invention, hash indices resulting from the paired indexes are used as addresses for insertion of data into a hash table or to search for data words that are an exact and approximate match of a target data word associated with the hash indices.

According to another aspect of the invention, as a possible alternative to direct pairwise organization, indices are retrieved from all identified hash indices and merged using a selection tree. The selection tree is used to identify multiple occurrences of an index indicating that the index is within a predetermined Hamming distance of the index used as the search term.

The invention distinguishes and identifies two particular types of difference or error vectors. For example, consider a Golay code (23, 12, 7) defining $2^{11}$ decoding spheres, each of radius three representing 0, 1, 2 and 3 bits of distortion of a codeword vector defining the center of each decoding sphere. If we are interested in finding all two-bit distortions of the codewords contained within a decoding sphere, we find a set of codewords at distances 0 and 1 from the center that, when two additional bits are distorted, still define a vector point within that decoding sphere. That is, all two-bit distortions of points located at the center of the sphere or within a distance one of the center of the sphere necessarily fall within the same decoding sphere.

However, vector points representing two-bit distortions from the center of the decoding sphere, when subject to distortion by two additional bits, may define vectors outside that sphere, located instead in one of twenty-one an adjacent decoding spheres. The invention implements a method of identifying the 22 decoding spheres, i.e., the center decoding sphere and 21 adjacent decoding spheres.

Likewise, vector points representing three-bit distortions from the center of a decoding sphere also define nearby vectors outside the central index decoding sphere and included in five adjacent decoding spheres. Again, a method according to the invention identifies the centers of these six decoding spheres, i.e., the center decoding sphere and 5 adjacent decoding spheres.

The invention advantageously utilizes pairwise combinations of a central index decoding sphere and all adjacent decoding spheres (each identified as a vector defining the center of the decoding sphere) to form sets of hash indices into which a dictionary entry is stored. Thus, in the case of dictionary entries at a distance two from the center of a particular central index decoding sphere, the twenty-one adjacent spheres are located and identified by their respective center points or vectors describing the center points of these spheres. The dictionary entry is stored (or searched for) in the twenty-one combinations formed by a lexigraphic ordering of pairs of the central index decoding sphere with the twenty-one adjacent decoding spheres.

In the case of entries falling a distance three from a center of a central index decoding sphere, the five adjacent decoding spheres are identified, the centers of the central index decoding sphere and adjacent spheres formed in pairwise combinations thereby creating fifteen $$\binom{6}{2}$$

pairs of vectors (the vectors of each pair ordered in lexicographical sequence) forming hash indices into which the subject term is stored.

Rather than storing lists of target terms, according to a preferred embodiment of the invention, pointers are stored referencing these target terms. Storing pointers or indices to the target terms has the advantage of providing for efficient elimination of duplicates. That is, multiple occurrences of a particular distortion of a bit vector may be identified when searching through the fifteen or 21 hash indices identified by application of the reverse Golay indexing scheme.

As previously described, as the Hamming distance between terms decreases, the terms have more hash indices in common so that multiple occurrences of a term may be found. For example, terms varying by 0, 1 or 2 bits, if they have more than one hash, they will have at least two codewords in common. Pairwise combination of these codewords will eliminate duplicates of close matches, but not exact matches. Further, absent pairing of indices, duplicates terms for close matches must be eliminated.

According to a feature of the invention, an array—a pairing table spanning a range of indexes corresponding to the pointer or index values used to access the dictionary terms or attribute matrices is used to store flags indicating whether a particular term has already been included within an output listing. Thus, upon identification of a particular dictionary term, an appropriate bit of the array is checked to see if that term has already been identified and therefore represent a duplicate. If the bit has not been set, then the term is output and the bit is set so that future identifications of the term are flagged as duplicates and are not output. The system may track set bits so that these bits can be reset, thereby reinitializing the array after all terms have been output.

According to another feature of the invention, a selection tree is used to identify duplicate terms to avoid multiple identifications of the term.

Thus, according to one aspect of the invention, a data dictionary includes an inverse fault-tolerant decoder configured to transform a data vector into a plurality of predetermined index values. Combinational logic is configured to combine pairs of the index values to form corresponding combined hash indices. A data store is configured as a hash table referencing indexed data corresponding to the combined hash indices. The data vector may comprise a bit-attribute vector of a predetermined length appropriate to the inverse fault-tolerant code implemented by the inverse fault-tolerant decoder. Preferably, the inverse fault-tolerant decoder implements a reverse perfect error correction code such as a reverse Golay code or, possibly, an appropriate Hamming code.

According to another feature of the invention, the inverse fault-tolerant decoder identifies and classifies the data vectors into at least two types including (i) a border vector type located at (or identifying a point located at) a border of a decoding sphere and (ii) a non-border vector type located interior to the decoding sphere. As used herein, the decoding sphere represents all codes within a predetermined number of bits subject to correction by the selected error correction code, the border or outer shell of the decoding sphere comprising codes located a maximum bit distance from the center of the decoding sphere representing a corrected codeword, inner shells interior to the decoding sphere representing indices having fewer errors or bit distortions than the maximum number capable of correction by the selected error correction code.

According to a feature of the invention, the inverse fault-tolerant decoder is configured to identify whether the data vector is a border vector type, e.g., defines a codeword in the outermost shell of the decoding sphere representing a maximum Hamming distance from the center of the decoding sphere which may be corrected back and uniquely identified with the decoding sphere as a member of a population represented by an included within the decoding sphere. Thus, once identified, the data vector or point represented by the data vector is decomposed into two components including a data vector representing the center of the decoding sphere containing the original data vector and an offset data vector representing a difference (e.g., an error or maximum bit distortion) relative to the center of the decoding sphere. An iterative method is then initiated in which one bit offsets from the subject data vector are computed and a corresponding offset vector relative to an adjacent decoding sphere containing the one-bit distorted codeword is computed. This process is continued until an exclusive all offset vectors results in all "1s". The result of this process is to efficiently identify all adjacent decoding spheres containing one-bit variations of a border vector type data vector. For example, in a Golay code (23, 12, 7) this method identifies the five adjacent decoding spheres containing one-bit distortions of a specified data point represented by a data vector present on the outermost shell of a central index decoding sphere.

According to another feature of the invention, a data vector may be identified as a non-border vector type interior to a central index decoding sphere, e.g., representing a distance two from the center of the central index decoding sphere in the Golay code (23, 12, 7) example. An offset vector is identified describing the data vector relative to the center of the central index decoding sphere. Centers of adjacent decoding spheres within the specified offset distance (e.g., two bits) of the data vector are then identified and, combinations of the centers of the (i) central index decoding sphere and (ii) adjacent decoding spheres are formed in lexicographical order to form the combined hash indices.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF DRAWINGS

The drawing Figures depict the present invention by way of example, not by way of limitations. In the Figures, like reference numerals refer to the same or similar elements.

FIG. 5A is a diagram the anatomy of shells of codewords;

FIG. 5B is a diagram depicting the classification of codewords within a Hamming distance 2 of a center of a codeword sphere;

FIG. 5C is a diagram depicting the classification of codewords within a Hamming distance 2 of a displacement vector of weight 1;

FIG. 5D is a diagram depicting the classification of codewords within a Hamming distance 2 of a displacement vector of weight 2;

FIG. 5E is a diagram depicting the classification of codewords within a Hamming distance 1 of a displacement vector of weight 3 (i.e., a border case);

DETAILED DESCRIPTION OF THE INVENTION

The invention provides a method of and system for implementing a dictionary implementing an inverse fault-tolerant decoder. The (central index or primary) codeword sphere and offset vector are identified for a particular target bit-attribute vector. The bit attribute vectors is then categorized as one in which a predetermined distortion value will either (i) be contained within the central index codeword sphere or (ii) result in an incursion into adjacent codeword spheres. In the first case, only one codeword is generated, that corresponding to the codeword sphere. In the latter case, the adjacent codeword spheres are identified and combined with the central index codeword sphere to form hash indices.

Using a fault-tolerant code in which similar bit-attribute vectors produce a predetermined number of equal index values the index values are combined accordingly. Thus, for example, using an inverse Golay code in which two of six codeword spheres will be commonly identified for any two bit-attribute vectors within a Hamming distance of 2, the resultant indices are paired to produce a set of hash indices. The pairing addresses may be dependent upon the offset vector.

For example, using a Golay Code (23,12,7), an offset vector of weight 2 is, according to one implementation of the invention, associated with 5 adjacent codeword spheres. In this case, we can expect that all bit-attribute vectors within a Hamming distance 2 of the original target bit-attribute vector will be found in two of the six codeword spheres (i.e., the one central index and five adjacent codeword spheres.) Thus, the six codewords for the respective codeword spheres are combined in pairs as a combination of six taken two at a time:

$$\binom{6}{2}$$

resulting in 15 pairs. In the case of an offset vector of weight 3 (also referred to herein as a border vector,) we expect that all bit-attribute vectors within a Hamming distance 2 of the original target bit-attribute vector will be found in both the central index and in one of 21 adjacent codeword spheres. Thus, the central index codeword is paired with each of the 21 adjacent codewords to form 21 pairs.

Figure 4:
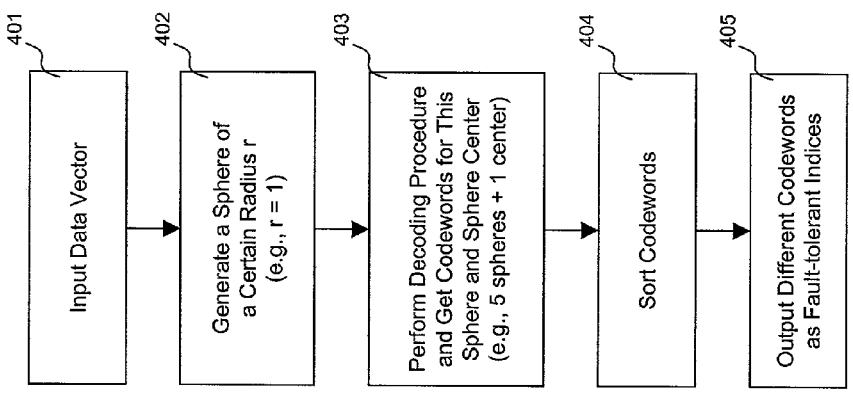
FIG. 4 is a flowchart of a reverse error correction procedure used to generate fault-tolerant indices.

FIG. 4 is a flowchart of a procedure according to the invention for a reverse error correction procedure used to generate fault-tolerant indices. At step 401, a data vector or attribute vector is input and, at step 402, a sphere of a certain radius "r" is generated. At step 403, a decoding procedure is performed to get codewords for this sphere and to get the sphere center. At step 404, the codewords are sorted and, at step 405, different codewords are output as fault-tolerant indices.

FIG. 5A illustrates the anatomy of the shells of codewords. In this example, a codeword sphere represents a universe of 23-bit codewords. A central codeword 502 is defined by the particular fault-tolerant code, in this case, a Golay Code (23, 12, 7) such that a particular 12-bit data word in transformed into central 23-bit codeword. The set of 1-bit distortions of central codeword 502 consists of twenty-three 23-bit codewords forming a distance 1 shell 403. Similarly, the set of 2-bit distortions forms distance 2 shell 504 consisting of $$\binom{23}{3}$$

or 253 23-bit codewords. Finally, 3-bit distortions form an outer, distance 3 "border" shell 505 including $$\binom{23}{2}$$

or 1771 23-bit codewords. Thus, codewords in a Golay code (23, 12, 7) maybe classified as those falling within a distance 2 of a central codeword (FIG. 5B), within a distance 2 of a distance 1 codeword (FIG. 5C), a distance 2 of a distance 2 codeword (FIG. 5D) or a distance 1 of a distance 3 codeword, thus covering all 2-bit distortions of all codewords within a distance 2 of a central codeword.

Figure 3:
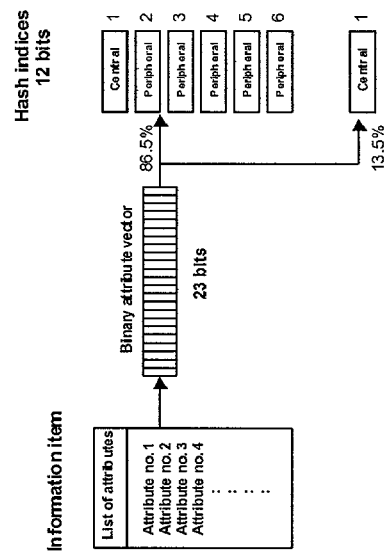
FIG. 3 is a diagram of a basic scheme for fault-tolerant hashing with Golay code transformation.
Figure 1:
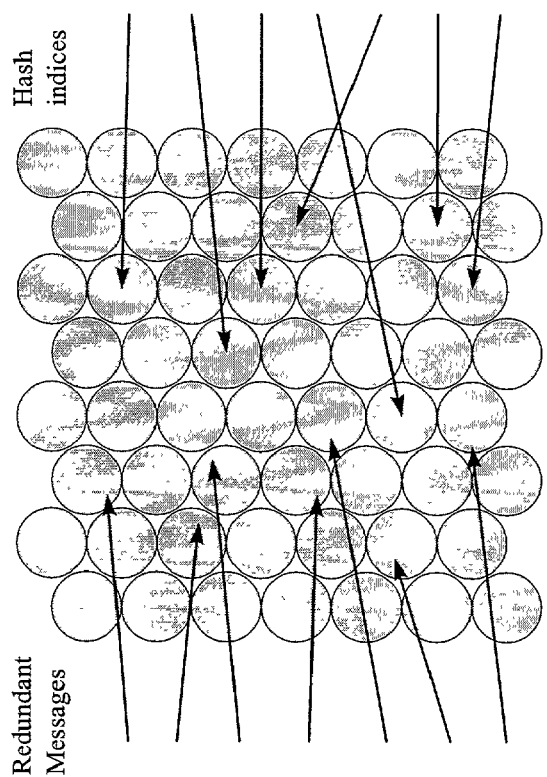
FIG. 1 is a diagram illustrating hash functions tolerating key distortions.
Figure 6B:
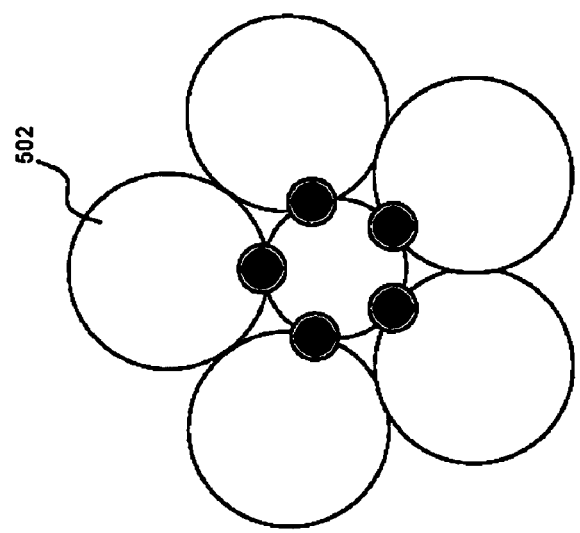
FIG. 6B is a diagram of a geometry of adjacent codeword spheres for distance 2 (i.e., border) codewords.
Figure 6A:
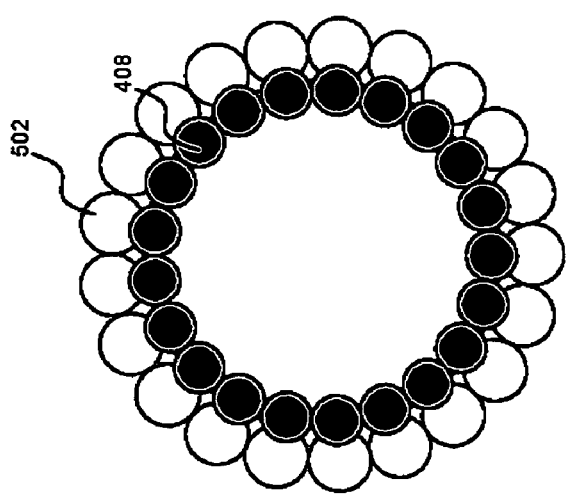
FIG. 6A is a diagram of a geometry of adjacent codeword spheres for distance 2 codewords.

The subject embodiment of the invention distinguishes between processing wherein all distortions of a given codeword are contained with a central index sphere (FIGS. 5B and 5C) and where the distortions may fall outside the central index sphere into adjacent codeword spheres (FIGS. 5D and 5E.) As shown in FIG. 6A, 2-bit distortions 608 of distance 2 codewords result in codewords contained in one of 22 spheres: central index sphere 601 and 21 adjacent code spheres 602. Similarly, as shown in FIG. 6B, 1-bit distortions 609 of distance 3 codewords are contained within 6 spheres: central index sphere 601 and 5 adjacent code spheres 602.

Figure 2A:
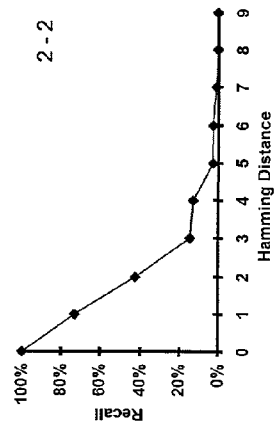
FIG. 2A is a graph characterizing the retrieval capabilities with Golay code partitionings matching two neighborhoods of size 1.
Figure 2B:
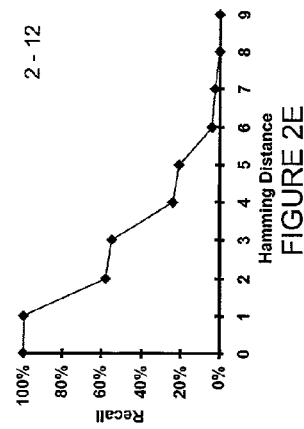
FIG. 2B is a graph characterizing the retrieval capabilities with Golay code partitionings matching two neighborhoods of size 1 versus 6.
Figure 2C:
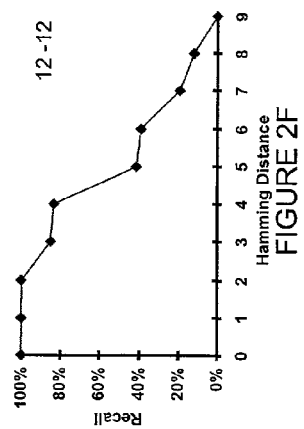
FIG. 2C is a graph characterizing the retrieval capabilities with Golay code partitionings matching two neighborhoods of size 6.
Figure 2D:
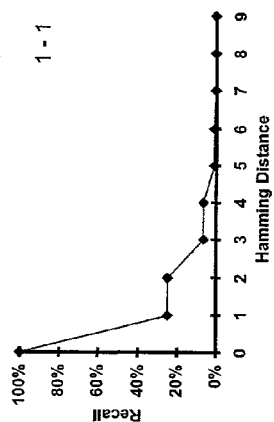
FIG. 2D is a graph characterizing the retrieval capabilities with Golay code partitionings matching two neighborhoods of size 2.
Figure 2E:
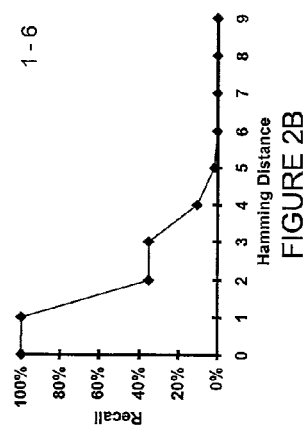
FIG. 2E is a graph characterizing the retrieval capabilities with Golay code partitionings matching two neighborhoods of size 2 versus 12.
Figure 2F:
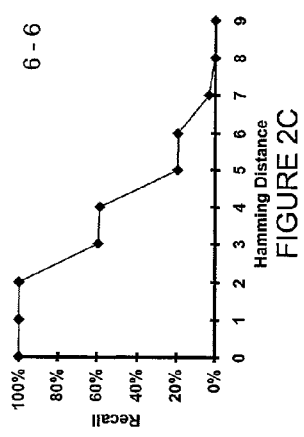
FIG. 2F is a graph characterizing the retrieval capabilities with Golay code partitionings matching two neighborhoods of size 12.
Figure 7:
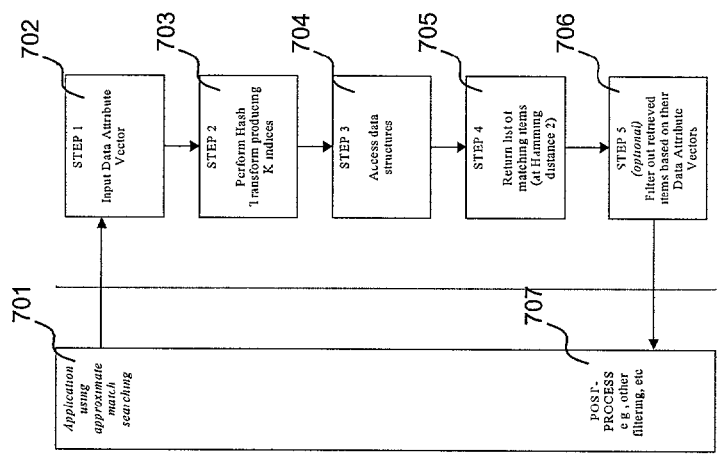
FIG. 7 is a flow diagram of a method of find a list of "approximate matches" by reversing an error-correction scheme to implement fault-tolerant indexing.

FIG. 7 is an overall flow diagram of a basic process for finding a list of "approximate matches" according to the invention. Steps 701 and 707 represent external calls to and return from a dictionary system according to the invention including steps 702–706. Thus, in step 701, an application, using approximate match searching, invokes a dictionary according to the invention at Step 702. At this first step, a data attribute vector of N bits is received. As previously described, the data attribute vector may represent a wide range of information that may be transformed into binary attributes. The vector should be compatible with the error correction code being used, correspond to the size of the code word supported by the selected error correction code. In the case of the Golay Code (23,12,7), the attribute vector would comprise 23 bits to be decoded into a 12 bit data word. Once the data attribute vector is formulated, a hash transform is performed at Step 703 to produce K indices of I bits each. At Step 704 the K indices are used to access a data structure such as a hash table, a hierarchical structure such as a prefix tree, etc. In Step 705 a list is returned including matching items falling within a pre-determined Hamming distance of the input data attribute vector. For example, according to a preferred embodiment of the invention using the (23,12,7) Golay Code, all items within a Hamming distance of two are returned, with a high percentage of less closely matching items also being made available as shown in FIG. 2C. This output may be filtered at Step 706 based on the data attribute vectors of the returned items so as to filter out non-matching items and/or items outside of some other criteria (e.g., more than a predetermined Hamming distance from the input data attribute vector.) This output is then provided for post-processing at step 707 including steps required to utilize the data (not shown).

Figure 8:
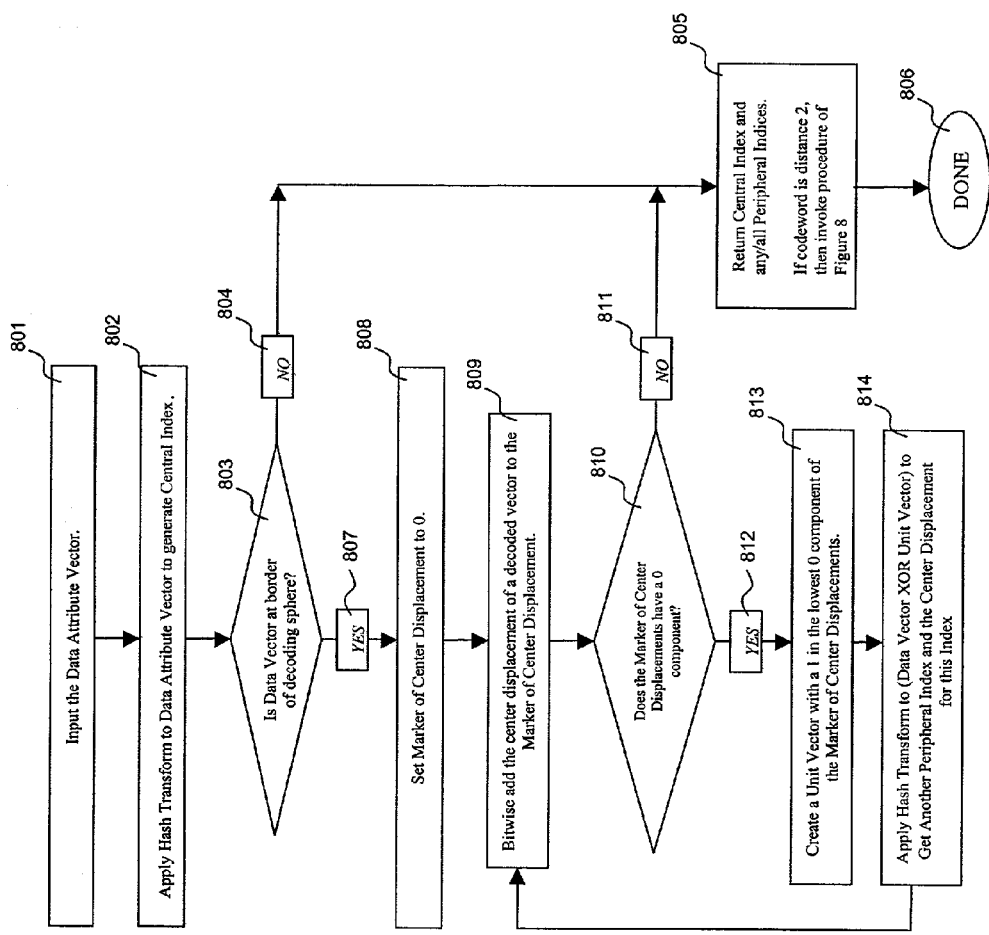
FIG. 8 is a flow chart of a method for generating six hash indices from a data attribute vector of "distance 3 points"

FIG. 8 is a flow diagram of a general process for testing for distance 3 border vectors and generating the associated 6 hash indices. At Step 801 the bit representation of the data item is received as a data attribute vector. Step 802 applies a hash transform to the data attribute vector to generate a central index representing the center of the central index decoding sphere including the vector. That is, the Central Index represents the data word recovered from the data attribute vector using a selected fault-tolerant code. According to a preferred embodiment of the invention, the inverse error correcting code is based on the Golay Code (23,12,7) so that Step 802 transforms a 23 bit data attribute vector into a 12 bit central index. At decision 803, a test is performed to determine if the data vector is at the border of a decoding sphere. Thus, if the data vector is, in a case of a Golay Code (23,12,7). a distance of less than 3 from the center of the decoding sphere, then test 803 is failed and processing continues through path 804 to return a central index and any and all peripheral indices at Step 805 as further detailed below, terminating at 806. If instead, the data vector is at the border of the decoding sphere, the test at decision 803 is passed and processing continues via 807 to set a marker of the center displacement to zero at Step 808. This marker is used to keep track of the number of adjacent spheres probed in the subsequent loop beginning at Step 809 and continuing through Step 814 so as to implement a routine for identifying each of the adjacent decoding spheres in sequence until all five such spheres are probed. Thus, at Step 809, the center displacement of the decoded vector is bit-wise added to the marker of the center displacement. At Step 810, a termination test is performed to determined if the marker of a center displacements has a zero component. If the marker of center displacements is completely set to all "ones," (i.e., all adjacent code spheres have been addressed) then the test is failed and processing continues via 811 to, at Step 805, return the central index and any and all peripheral indices, and then, as before, terminate at Step 806. Otherwise, if the marker of center displacements has a zero component, indicating that more unprobed adjacent decoding spheres remain, then processing continues at 812 to, at Step 813, create a unit vector with a one in the lowest zero marker of displacements, i.e., a unit vector with the one occurring in the least significant bit of the marker of center displacements having a zero bit value. Then, at Step 814, a hash transform is applied to a result of "exclusive or" (XOR) of data vector with the unit vector to generate another peripheral index and the center displacement for the index. Processing then loops back to continue at Step 809 to update the marker of center displacement based on the newly generated peripheral index.

Figure 9:
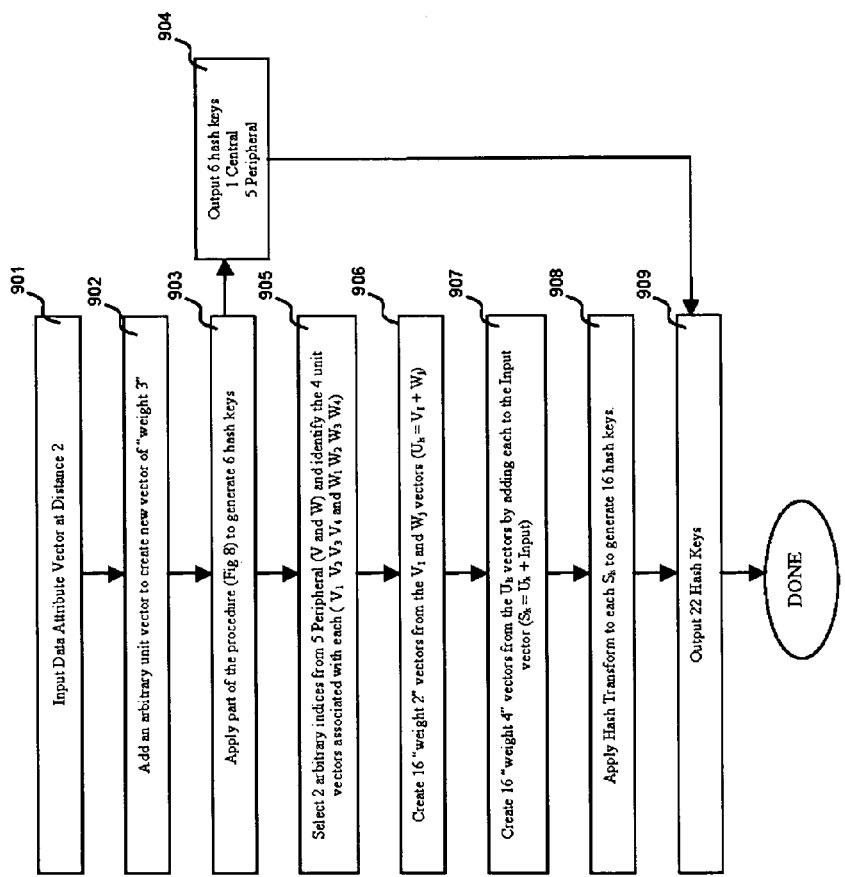
FIG. 9 is a flow chart of a procedure for generating 22 hash indices from a data attribute vector of "distance 2 points"

FIG. 9 is a flow diagram of a procedure for generating the 22 hash indices for "distance two points." That is, an attribute vector defining points a Hamming distance to and from the center of a decoding sphere, when subject to additional one bit distortions of the 23 bit code words, result in code words found in a total of 22 code words spheres, the originating or central index sphere and 21 adjacent code spheres. Thus, Step 901, the process receives a 23-bit "weight 2" attribute vector and, at Step 902 an arbitrary unit vector is added to the 23-bit vector to create a new vector of weight 3. At Step 903, the newly created weight 3 vector is used to generate six hash keys using part of the procedure shown in detail in connection with FIG. 8. Thus, the output provided at Step 806 (FIG. 8) is output at Step 904 including the six hash keys, i.e., one central and five peripheral keys. At Step 905 two of the peripheral indices V and W are arbitrarily selected and four unit vectors ($V_1$ $V_2$ $V_3$ $V_4$ and $W_1$ $W_2$ $W_3$ $W_4$) corresponding to each are identified. At Step 906 16 weight 2 vectors $U_k$ are created by pairwise summing combinations of the unit vectors $V_i$ and $W_j$ (i.e., the center and off set values) identified in Step 905. At Step 907 16 weight 4 vectors $S_k$ are created from the $U_k$ vectors by adding each to the original 23-bit input vector. A hash transform is applied to Step 908 to each of the resultant $S_k$ vectors to generate 16 hash keys and, together with the previously generated 6 hash keys output at Step 904, are output for a total of 22 hash keys at Step 909.

Figure 10:
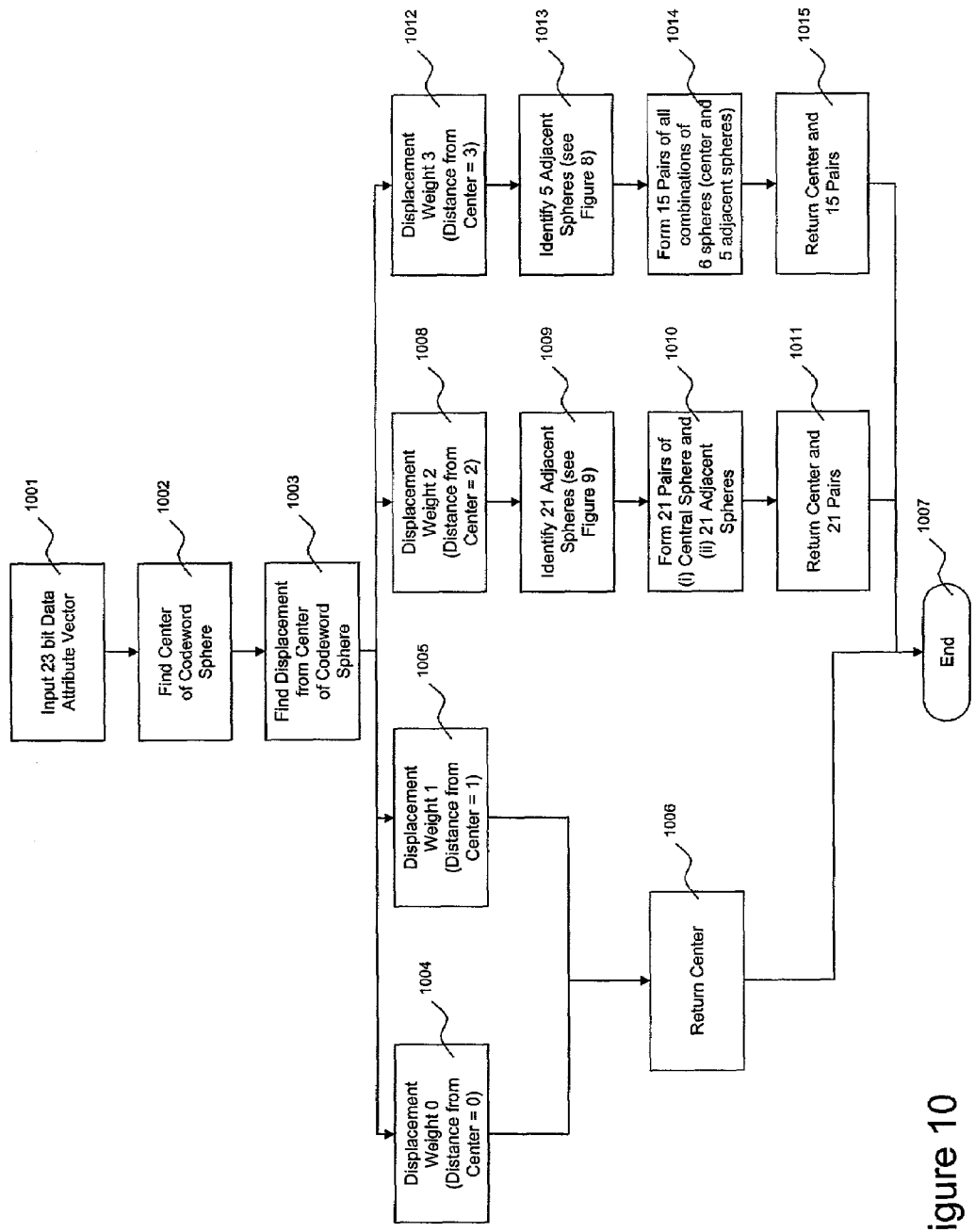
FIG. 10 is a flow chart of a procedure for generating access pair keys for binary vectors.

FIG. 10 is a flow chart of a procedure for generating access pair keys for binary vectors. A 23-bit attribute vector is input at step 1001 and, at step 1002, the center of the corresponding codeword sphere is identified. Step 1003 then determines the displacement of the codeword vector from the center of the codeword sphere. Depending on the displacement, processing continues at steps 1004, 1005, 1008 or 1012, corresponding to displacements of 0, 1, 2 and 3, respectively. In the case of displacements of 0 and 1, it is only necessary that the center of the codeword sphere be returned, steps 1004 and 1005 both leading to step 1006, the process terminating at step 1007.

In the case of distance 2 codewords (step 1008), the 21 adjacent spheres are identified at step 1009 according to the procedure detailed in connection with FIG. 9. At step 1010, the vector representing the central sphere is paired with the vectors representing each of the 21 adjacent spheres to form 21 pairs. These 21 pairs are returned together with the center of the codeword sphere at step 1011 and the process terminates at step 1007.

In the case of distance 3 codewords (step 1012), the 5 adjacent spheres are identified at step 1013. Paired combinations of the 5 adjacent spheres together with the codeword sphere center are formed resulting in 15 pairs at step 1014. These 15 pairs are returned at step 1015 and the process terminated at step 1007.

Once the hash keys are identified, there are a number of data structures which are used according to the invention, each one has a different access method. For example, with reference to FIG. 10, a hash tables may be employed using linked lists, in this case, data items with a number of hash indices, (i.e., having multiple hash indices). Data items having multiple hash indices are inserted into an appropriate hash table such as one labeled "HashTableMultiples." Conversely, data items having a single hash index are, according to a preferred embodiment of the invention, inserted into a separate hash table such as one labeled "HashTableOnes." This latter table would also be formatted as per FIG. 10 but, of course, would not have duplicate lists of data items, each data item being listed in a single slot with reference to a particular hash index. The list of data items may be maintained as an array, or more preferably as a linked list, and/or, linked list of pointers referencing the data items.

Figures 11, 12A, 12B, 12C, 12D:
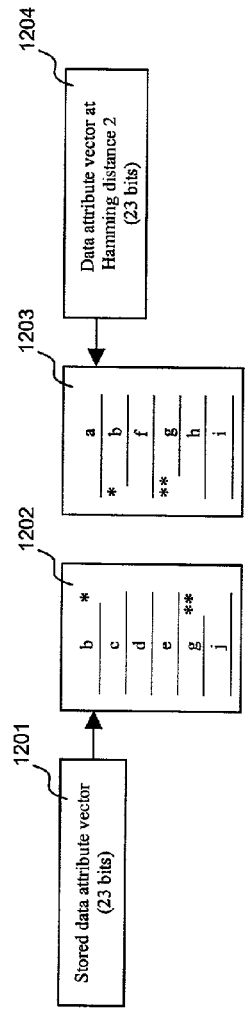
FIG. 11 is a diagram of a regular hash table with a bucket structure.
FIG. 12A is a diagram showing the identification of border binary vectors in the Golay code scheme using index pairs.
FIG. 12B is a listing of index pairs.
FIG. 12C is a listing of index pairs for the leftmost list of FIG. 12A.
FIG. 12D is a listing of index pairs for the rightmost list of FIG. 12A.

FIG. 12A shows the 6 12-bit indices used to identify border binary vectors (i.e., vectors having a distance three from the center of a codeword sphere) in a Golay code scheme using index pairs. As shown in the Figure, a stored bit attribute vector including 23 bits is represented at 1201. The 23 bits are subject to application of the inverse Golay encoding to provide multiple hash indices, in this case 6 hash indices representing a central code sphere and 5 adjacent code spheres. Similarly, a data bit attribute vector 1204 at a Hamming distance 2 from the stored bit is encoded to result in the generation of 6 12-bit indices as shown in table 1203. (It should be noted that a bit attribute vector at a Hamming distance 2 from the center of a codeword sphere would result in the generation of 22 hash keys as would be reflected in an expanded table 1203).

A property of vectors a Hamming distance 2 apart using a Golay code results in the vectors having 2 of their respective 6 indices in common as shown in FIG. 12A. Thus, the first index of Table 1202 corresponds to the second index of Table 1203 (i.e., has the same value "b") as indicated by the "*" designation, while the fifth entry of Table 1202 has the same value as the index appearing as the fourth entry in Table 1203 as indicated by the "**" designation (value "g").

This property in which similar vectors have two indices in common is used to the advantage by the invention has shown in FIG. 12B. Thus, the 6 indices associated with Golay decoding of respective 23 data attribute vectors are paired in all combinations so that we would expect one of these combinations to match with one of the 15 combinations of the index pairs produced by a near match data attribute vector. That is, with reference to FIG. 12A, we expect the first and fifth entry of Table 1202 as represented by ordered pair 1,5 to be the same as, and thereby match, ordered paired 2,4 of Table 1203.

An example is given in connection with FIGS. 12C and 12D, FIG. 12C representing the indices of this 1202 paired with the given values shown by letters b, c, d, e., g, and j and FIG. 12D presenting pairs of indices individually represented in list 903 as index values a, b, f, g, h, and i. Thus, list 1202 results in the generation of pairs shown in FIG. 12C while list 1203 results in the generation of the pair shown in FIG. 12D. As can be seen from FIG. 12A, the pair b, g of list 1202 is also shown in list 1203 such that the ordered pair <b, g> appearing as the fourth entry in the first row of FIG. 12C matches the ordered pair in the second row, second column of FIG. 12D. Thus, using these ordered pairs as access pairs or hash indices into a table as shown in FIG. 9, we stored the originating bit attribute vector is stored at each of these hash indices. Therefore, it is necessary that all 15 hash indices be checked for attribute vectors meeting the required matching criteria to identify all such attribute vectors.

Figure 13:
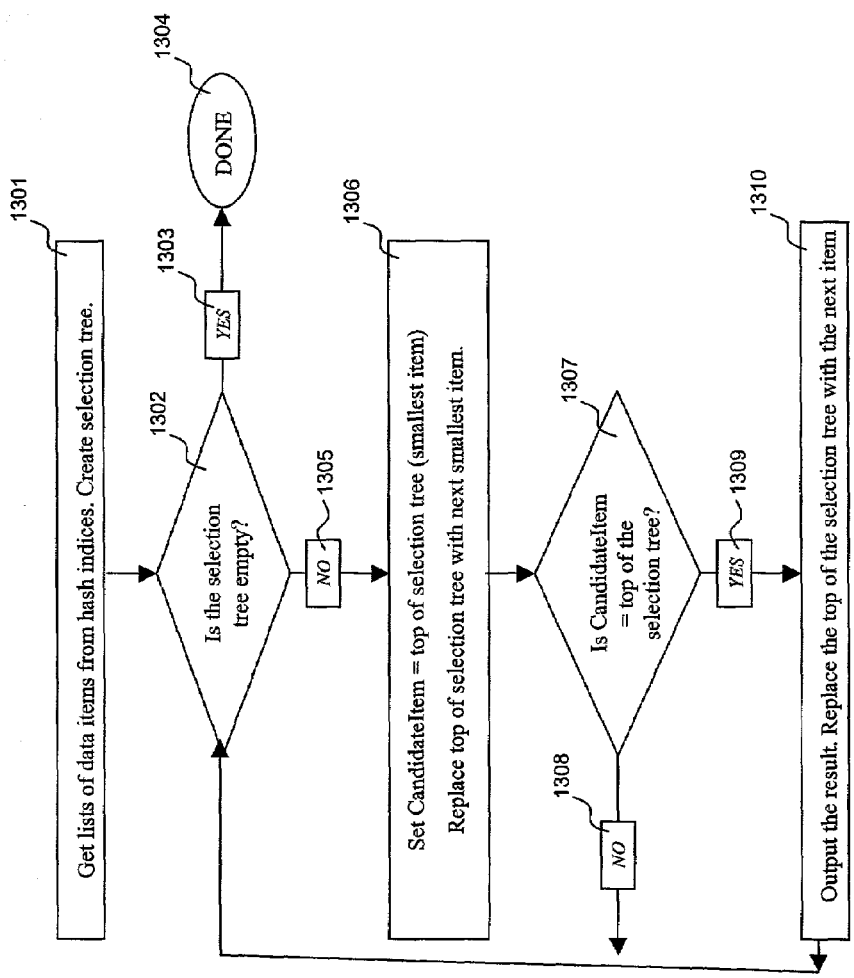
FIG. 13 is a flow diagram of a retrieval process based on a merge using a selection tree.

FIG. 13 is a flow diagram of a procedure for generating access pair keys for binary vectors. This procedure may be used to identify multiple occurrences of a data item indicating that it qualifies as a near match, the procedure usable instead of the above described index pairing technique. Thus, according to the procedure of FIG. 13, all data items of a particular grouping of code spheres (i.e., 22 code spheres for distance 2 codewords and 6 code spheres for distance 3 codewords) are retrieved and examined to identify multiple occurrences of one of the data items. Identification of such multiple occurrences indicates that the data item is a near-match, i.e., within a distance 2 of the target data item.

At step 1301, a list is obtained of data items referenced by the hash indices and a selection tree is created. A test is performed at step 1302 to determine if the tree is empty and, if all data items have been bubbled up through the top of the tree, at step 1303 the procedure is exited and terminated at step 1304. Conversely, if there are further data items remaining in the tree, then processing continues through step 1305, and, at step 1306. The top element of the selection tree is stored as a candidate element to determine if it is the smallest item of those under examination, in this case the variable used is labeled "CandidateItem." This results in replacement of the top of the selection tree with the next smallest item. A test is performed at step 1307 to determine if the CandidateItem is equal to the top of the selection tree and if not, processing continues through step 1308 to the top of the loop to examine the next element. On the other hand, if the CandidateItem is equal to the top of the selection tree, then processing continues through steps 1309 and step 1310, the result is output, and the top of the selection tree is replaced with the next item of the tree.

Figure 14:
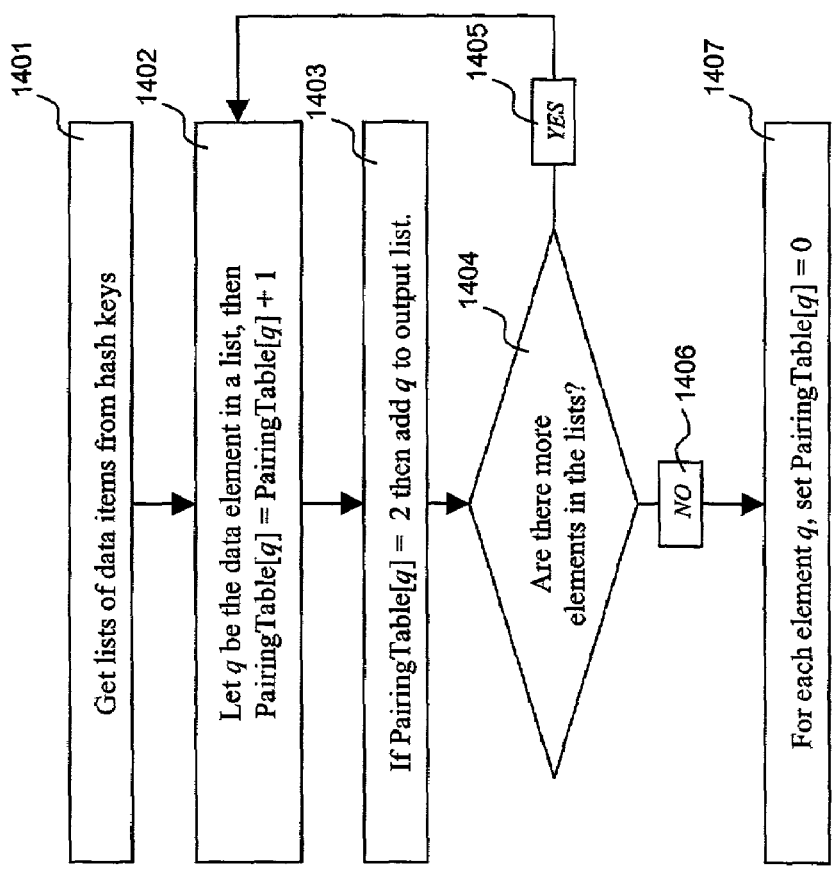
FIG. 14 is a flow diagram of an alternate method of extracting data using a pairing table.

Another method of identifying data items satisfying a particular maximum distortion criteria (e.g., within a distance 2 of a target data item) and/or returning a list without duplicates relies on a pairing table which is initialized to all zeros when the data structures are loaded. Referring to FIG. 14, extracted data items using the pairing table are provided as lists from hash keys at step 1401. At step 1402, the table entry corresponding to the data item is incremented. That is, if q is a data element in the list, then the next record is then indexed, i.e., PairingTable [q]=PairingTable [q]+1. At step 1403, the data item "q" is output if the count contained in PairingTable [q]=2, i.e., there is at least one match of the hash keys. A test is performed at 1404 to see if there are more elements in the list to process and, if so, branch back via step

1405 to step 1402. Conversely, if the list is exhausted, then processing continues via step 1406 to step 1407 which selectively, for each element q, sets Pairing Table [q]=0. It should be noted that this last step selectively reinitializes the Pairing Table so as to reset only those records requiring resetting instead of arbitrarily reinitializing all values to 0. One skilled in the art would recognize that there is a substantial resource and time savings realized by selective reinitialization of only those entries affected by the process.

While the foregoing has described what are considered to be preferred embodiments of the invention, it is understood that various modifications may be made therein and that the invention may be implemented in various forms and embodiments, and that it may be applied in numerous applications, only some of which have been described herein. It is intended by the following claims to claim all such modifications and variations which fall within the true scope of the invention.

It should further be noted and understood that all publications, patents and patent applications mentioned in this specification are indicative of the level of skill of those skilled in the art to which the invention pertains. All publications, patents and patent applications are herein incorporated by reference to the same extent as if each individual publication patent or patent application was specifically and individually indicated to be incorporated by reference in its entirety.

What is claimed is:

1. A data dictionary comprising:
    an inverse fault-tolerant decoder implemented for an error-correction code configured to transform a data vector into a plurality of predetermined index values;
    logic configured to combine pairs of said index values by concatenating pairs of said index values to form corresponding pairwise combined hash indices; and
    data storage configured as a hash table referencing indexed data stored in the data dictionary corresponding to said pairwise combined hash indices,
    wherein said inverse fault-tolerant decoder implements a reverse Golay code and is configured to:
    identify said data vector as a non-border vector type;
    identify an offset vector of said data vector from a center of a central index decoding sphere representing a specified offset distance;
    identify centers of adjacent decoding spheres within said specified offset distance of said data vector; and
    concatenate (i) hash indexes corresponding to said centers of each of said adjacent decoding spheres with (ii) a hash index corresponding to said center of said central index decoding sphere to form respective pairs of hash indexes.

2. The data dictionary according to claim 1 wherein said data vector comprises a bit-attribute vector.

3. The data dictionary according to claim 1 wherein said inverse fault-tolerant decoder implements a reverse perfect error correction code.

4. The data dictionary according to claim 1 wherein said inverse fault tolerant decoder is further configured to identify said data vector as one of (i) a border vector type located at a border of a decoding sphere and (ii) a non-border vector type located interior to said decoding sphere.

5. The data dictionary according to claim 1 wherein said inverse fault-tolerant decoder is configured to:
    identify said data vector as a border vector type;
    define an offset of said data vector from a center of a decoding sphere of an error-correction code implemented by said inverse fault-tolerant decoder; and
    identify offsets from adjacent decoding spheres of said error-correction code.

6. The data dictionary according to claim 1 wherein said logic is configured to combine pairs of said index values by pairing said index values in lexicographical order to form said corresponding pairwise combined hash indices.

7. A method of accessing a dictionary comprising the steps of:
    transforming a data vector into a plurality of predetermined index values;
    concatenating pairs of said index values to form corresponding pairwise combined hash indices; and
    referencing indexed data stored in the dictionary corresponding to said pairwise combined hash indices,
    wherein said transforming step further comprises the steps of
    (i) identifying said data vector as a non-border vector type,
    (ii) identifying an offset vector of said data vector from a center of a central index decoding sphere representing a specified offset distance,
    (iii) identifying centers of adjacent decoding spheres within said specified offset distance of said data vector, and
    (iv) concatenating (i) hash indexes corresponding to said centers of each of said adjacent decoding spheres with (ii) a hash index corresponding to said center of said central index decoding sphere to form respective pairs of hash indexes.

8. The method according to claim 7 wherein said data vector comprises a bit-attribute vector.

9. The method according to claim 7 wherein said transforming step implements a reverse perfect error correction code.

10. The method according to claim 9 wherein said reverse perfect error correction code comprises a reverse Golay code.

11. The method according to claim 7 wherein said transforming step further includes a step of identifying said data vector as one of (i) a border vector type located at a border of a decoding sphere and (ii) a non-border vector type located interior to said decoding sphere.

12. The method of accessing a dictionary according to claim 7 wherein said transforming step further includes the steps of
    (i) identifying said data vector as a border vector type,
    (ii) defining an offset of said data vector from a center of a decoding sphere of an error-correction code implemented by said inverse fault-tolerant decoder, and
    (iii) identifying offsets from adjacent decoding spheres of said error-correction code.

13. The method according to claim 7 wherein said step of combining includes combining said pairs of said indices values in lexicographical order to form said corresponding pairwise combined hash indices.

14. A data dictionary stored on a computer readable media, said data dictionary comprising:
    inverse fault-tolerant decoder logic configured to transform a data vector into a plurality of predetermined index values;
    logic configured to concatenate pairs of said index values to form corresponding pairwise combined hash indices; and
    a data storage structure configured as a hash table referencing indexed data of said data dictionary and corresponding to said pairwise combined hash indices, wherein said fault-tolerant decoder logic implements a reverse Golay code and is configured to:

identify said data vector as a non-border vector type;

identify an offset vector of said data vector from a center of a central index decoding sphere representing a specified offset distance;

identify centers of adjacent decoding spheres within said specified offset distance of said data vector; and concatenate (i) hash indexes corresponding to each of said centers of said adjacent decoding spheres with (ii) a hash index corresponding to said center of said central index decoding sphere to form respective pairs of hash indexes.

15. The data dictionary according to claim 14 wherein said data vector comprises a bit-attribute vector.

16. The data dictionary according to claim 14 wherein said inverse fault tolerant decoder logic is further configured to identify said data vector as one of (i) a border vector type located at a border of a decoding sphere and (ii) a non-border vector type located interior to said decoding sphere.

17. The data dictionary according to claim 14 wherein said inverse fault-tolerant decoder logic is configured to:

identify said data vector as a border vector type;

define an offset of said data vector from a center of a decoding sphere of an error-correction code implemented by said inverse fault-tolerant decoder; and identify offsets from adjacent decoding spheres of said error-correction code.

18. The data dictionary according to claim 14 wherein said logic is configured to combine pairs of said index values in lexicographical order to form said corresponding pairwise combined hash indices.

* * * * *